(12) United States Patent
Lee

(10) Patent No.: US 9,136,522 B2
(45) Date of Patent: Sep. 15, 2015

(54) PROTECTION CIRCUIT MODULE AND RECHARGEABLE BATTERY INCLUDING THE SAME

(75) Inventor: Myung-Jun Lee, Yongin-si (KR)

(73) Assignee: Samsung SDI Co., Ltd., Yongin-Si, Gyeonggi-Do (KR)

( * ) Notice: Subject to any disclaimer, the term of this patent is extended or adjusted under 35 U.S.C. 154(b) by 376 days.

(21) Appl. No.: 13/031,059

(22) Filed: Feb. 18, 2011

(65) Prior Publication Data

US 2011/0268996 A1 Nov. 3, 2011

(30) Foreign Application Priority Data

May 3, 2010 (KR) ........................ 10-2010-0041432

(51) Int. Cl.
*H01M 2/00* (2006.01)
*H01M 2/10* (2006.01)
*H01M 10/42* (2006.01)
(Continued)

(52) U.S. Cl.
CPC *H01M 2/30* (2013.01); *H01M 2/22* (2013.01); *H01M 2/34* (2013.01); *H01M 10/04* (2013.01); *H01M 10/425* (2013.01); *H05K 3/403* (2013.01); *H01M 2/0212* (2013.01); *H01M 2200/00* (2013.01); *H05K 1/189* (2013.01); *H05K 3/0064* (2013.01); *H05K 2201/09145* (2013.01); *H05K 2201/10037* (2013.01); *H05K 2201/2009* (2013.01)

(58) Field of Classification Search
CPC ......... H01M 10/42; H01M 2/10; H01M 2/00; H01M 10/50

USPC ........................ 429/7, 170, 175, 65, 121, 178, 429/181–182, 180, 50; 174/257, 261; 361/783, 748, 760, 106
See application file for complete search history.

(56) References Cited

U.S. PATENT DOCUMENTS 6,195,260 B1 * 2/2001 Moriyama ................... 361/749
2003/0108780 A1 * 6/2003 Iwaizono et al. ................. 429/7
(Continued)

FOREIGN PATENT DOCUMENTS

EP 2169757 3/2010
JP 2003-249204 A 9/2003
(Continued)

OTHER PUBLICATIONS

English Translation of KR1020060131623.*
(Continued)

*Primary Examiner* — Patrick Ryan
*Assistant Examiner* — Kiran Quraishi
(74) *Attorney, Agent, or Firm* — Knobbe Martens Olson & Bear LLP

(57) ABSTRACT

A protection circuit module of a rechargeable battery comprises a substrate formed of a flexible insulator and including a circuit supporting unit and a wiring supporting unit extending from the circuit supporting unit; a conductive circuit pattern unit formed on the circuit supporting unit; a conductive wiring unit formed on the wiring supporting unit, wherein the wiring unit is electrically connected to the circuit pattern unit and extends along the wiring supporting unit; circuit elements electrically connected to the circuit pattern unit and formed on one surface of the circuit supporting unit; and a reinforcement unit formed on an opposing surface of the circuit supporting unit and supporting the circuit supporting unit.

6 Claims, 4 Drawing Sheets

(51) Int. Cl.
  *H01M 2/30* (2006.01)
  *H01M 2/34* (2006.01)
  *H01M 10/04* (2006.01)
  *H01M 2/22* (2006.01)
  *H05K 3/40* (2006.01)
  *H01M 2/02* (2006.01)
  *H05K 1/18* (2006.01)
  *H05K 3/00* (2006.01)

(56) References Cited

U.S. PATENT DOCUMENTS

| | | | |
|---|---|---|---|
| 2003/0211385 A1 | 11/2003 | Yamazaki et al. | |
| 2009/0154048 A1* | 6/2009 | Jang et al. | 361/106 |
| 2009/0155631 A1* | 6/2009 | Baek et al. | 429/7 |
| 2009/0176156 A1* | 7/2009 | Lee | 429/178 |
| 2010/0081015 A1* | 4/2010 | Kim et al. | 429/7 |

FOREIGN PATENT DOCUMENTS

| | | | | |
|---|---|---|---|---|
| JP | 2006-019336 A | | 1/2006 | |
| KR | 1019990045606 | | 6/1999 | |
| KR | 20060118961 | | 11/2006 | |
| KR | 20070096775 | | 10/2007 | |
| KR | 1020060131623 | * | 10/2007 | ............ H01M 10/42 |
| KR | 10-2006-0131623 | * | 6/2008 | ............ H01M 10/42 |

OTHER PUBLICATIONS

English Translation of KR1020060131623 (Oct. 2007).*
Korean Office Action dated Jul. 14, 2011 in Application No. 10-2010-0041432.
Registration Determination Certificate dated Feb. 2, 2012 for corresponding to KR Application No. 10-2010-0041432.
Extended European Search Report issued on Mar. 24, 2015 for European Patent Application No. 11159237.4.

* cited by examiner

PROTECTION CIRCUIT MODULE AND RECHARGEABLE BATTERY INCLUDING THE SAME

CROSS-REFERENCE TO RELATED APPLICATIONS

This application claims the benefit of Korean Patent Application No. 10-2010-0041432, filed on May 3, 2010, in the Korean Intellectual Property Office, the disclosure of which is incorporated herein in its entirety by reference.

BACKGROUND

1. Field

One or more embodiments of the present invention relate to a protection circuit module and a rechargeable battery, and more particularly, to a protection circuit module capable of being easily manufactured at a minimized error rate by forming a reinforcement unit on a portion of a flexible substrate, and a rechargeable battery including the protection circuit module.

2. Description of the Related Technology

A battery typically includes a protection circuit for preventing overcharge or over-discharge. The protection circuit is generally formed on a rigid printed circuit board (PCB). The hard PCB including the protection circuit is typically connected to an external control circuit module or terminals of a battery module via wires. Since the wires or the terminals are connected to the hard PCB by using a soldering method, circuit elements mounted on the hard PCB may be thermally damaged due to heat transferred while a soldering operation is performed. Moreover, because the soldering operation for connecting wires to the hard PCB can be difficult, the error rate may be high.

SUMMARY

One or more embodiments of the present invention include a protection circuit module capable of being easily manufactured at a minimized error rate, and a rechargeable battery including the protection circuit module.

One or more embodiments of the present invention include a protection circuit module capable of protecting components of the protection circuit module from thermal damages, and a rechargeable battery including the protection circuit module.

One or more embodiments of the present invention include a protection circuit module with a reinforcement unit formed on a flexible substrate, and a rechargeable battery including the protection circuit module.

Additional aspects will be set forth in part in the description which follows and will be apparent from the description, or may be learned by practice of certain embodiments as described herein.

According to an embodiment of the invention, a protection circuit module of a rechargeable battery includes a substrate formed of a flexible insulator and including a circuit supporting unit and a wiring supporting unit extending from the circuit supporting unit; a conductive circuit pattern unit formed on the circuit supporting unit; a conductive wiring unit formed on the wiring supporting unit wherein the wiring unit is electrically connected to the circuit pattern unit and extends along the wiring supporting unit; circuit elements electrically connected to the circuit pattern unit and formed on one surface of the circuit supporting unit; and a reinforcement unit formed on an opposing surface of the circuit supporting unit and supporting the circuit supporting unit.

The reinforcement unit may be formed as a rigid insulating substrate and may be adhered to the opposing surface of the circuit supporting unit by an adhesive.

The reinforcement unit may be formed on the opposing surface of the circuit supporting unit by molding a resin.

The module may further include a protection layer formed on one surface of the substrate and covering the circuit pattern unit and the wiring unit.

The module may further include conductive terminal connection units formed, each terminal connection unit including one end connected to the circuit pattern unit and an opposing end formed at an edge of the circuit supporting unit, and the protection layer, the circuit supporting unit, and the reinforcement unit may include openings corresponding to the terminal connection units and exposing the terminal connection units.

Each of the terminal connection units may include a plurality of electrode layers, and the electrode layers may be separable from each other at the opposing end of each of the terminal connection units.

External terminals electrically may be connected to the wiring unit, externally exposed for electrical connection to an external device, and formed at an end of the wiring supporting unit.

According to another embodiment of the invention, a rechargeable battery includes a battery module including a pair of terminal electrodes protruding outside the battery module; and a protection circuit module including a substrate formed of a flexible insulator and including a circuit supporting unit and a wiring supporting unit extending from the circuit supporting unit; a conductive circuit pattern unit formed on the circuit supporting unit and electrically connected to the terminal electrodes; a conductive wiring unit formed on the wiring supporting unit, wherein the wiring unit is electrically connected to the circuit pattern unit and extends along the wiring supporting unit; circuit elements electrically connected to the circuit pattern unit and formed on one surface of the circuit supporting unit; and a reinforcement unit formed on an opposing surface of the circuit supporting unit and supporting the circuit supporting unit.

According to another embodiment of the invention, a protection circuit module of a rechargeable battery comprises a flexible substrate comprising a circuit supporting unit and a wiring supporting unit extending from the circuit supporting unit; a reinforcement unit formed on a surface of the circuit supporting unit to support the circuit supporting unit; and terminal connection units, each terminal connection unit comprising one end connected to the circuit pattern unit and an opposing end formed at an edge of the circuit supporting unit.

BRIEF DESCRIPTION OF THE DRAWINGS

These and other aspects will become apparent and more readily appreciated from the following description of the embodiments, taken in conjunction with the accompanying drawings of which.

DETAILED DESCRIPTION

Figure 1:
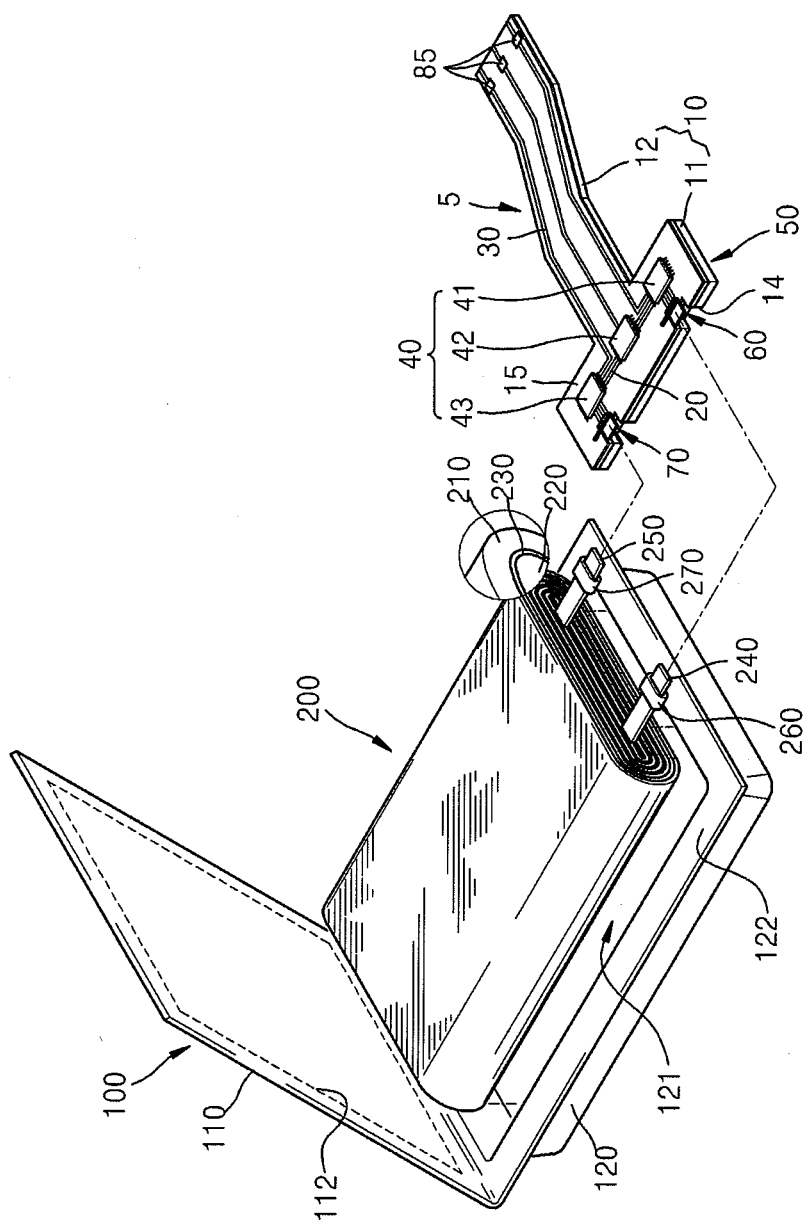
FIG. 1 is a perspective view of a rechargeable battery including a protection circuit module, according to an embodiment of the present invention.

Reference will now be made in detail to certain embodiments, examples of which are illustrated in the accompanying drawings, wherein like reference numerals refer to the like elements throughout. In this regard, the embodiments described herein may have different forms and should not be construed as being limited to the descriptions set forth herein. Accordingly, the embodiments are merely described below, by referring to the figures, to explain aspects of the present description.

FIG. 1 is a perspective view of a rechargeable battery including a protection circuit module 5, according to an embodiment of the present invention.

Referring to FIG. 1, the rechargeable battery includes a battery module 200 and the protection circuit module 5 connected to the battery module 200. The protection circuit module 5 includes a substrate 10, a circuit pattern unit 20, a wiring unit 30, a plurality of circuit elements 40, and a reinforcement unit 50. The protection circuit module 5 may be electrically connected to the battery module 200 via terminal connection units 60 and 70.

If the battery module 200 is accommodated and sealed in a case 100 including an upper cover 110 and a lower cover 120, a bare cell may be completely assembled.

Since the edges on one side of the upper and lower covers 110 and 120 may be integrally bonded to each other while the edges on three other sides of the upper and lower covers 110 and 120 may not be, the battery module 200 may be accommodated in the case 100. An accommodation unit 121 for accommodating the battery module 200 may be formed in the lower cover 120 by using, for example, a pressing method.

A lower sealing unit 122 that may be thermally bonded and sealed may be formed at edges of the lower cover 120, and the upper cover 110 can include an upper sealing unit 112 corresponding to the lower sealing unit 122.

The battery module 200 may be formed by winding a stack of a positive electrode plate 210 on which a positive electrode slurry including a positive electrode active material is coated, a negative electrode plate 220 on which a negative electrode slurry including a negative electrode active material is coated, and a separator 230 formed between the positive and negative electrode plates 210 and 220 so as to electrically insulate them from each other.

The positive electrode plate 210 may include a positive electrode active material layer on which the positive electrode slurry is coated on a positive electrode current collector formed of a material such as aluminum (Al), and a positive electrode uncoated part on which the positive electrode slurry is not coated on the positive electrode current collector. A positive electrode tab 240 may be bonded to the positive electrode uncoated part and may protrude from the case 100.

The negative electrode plate 220 may include a negative electrode active material layer on which the negative electrode slurry is coated on a negative electrode current collector formed of a material such as nickel (Ni), and a negative electrode uncoated part on which the negative electrode slurry is not coated on the negative electrode current collector.

A negative electrode tab 250 may be bonded to the negative electrode uncoated part and may protrude from the case 100. The positive and negative electrode tabs 240 and 250 of the battery module 200 correspond to terminal electrodes and may be electrically connected to the protection circuit module 5.

In order to improve the sealability of the case 100, portions of the positive and negative electrode tabs 240 and 250 where the upper and lower sealing units 112 and 122 overlap each other may respectively be surrounded by adhesive tab tape 260 and 270.

After the battery module 200 is accommodated and sealed in the case 100, the battery module 200 may be connected to the protection circuit module 5 in order to control charge and discharge and to prevent malfunction.

Figure 2:
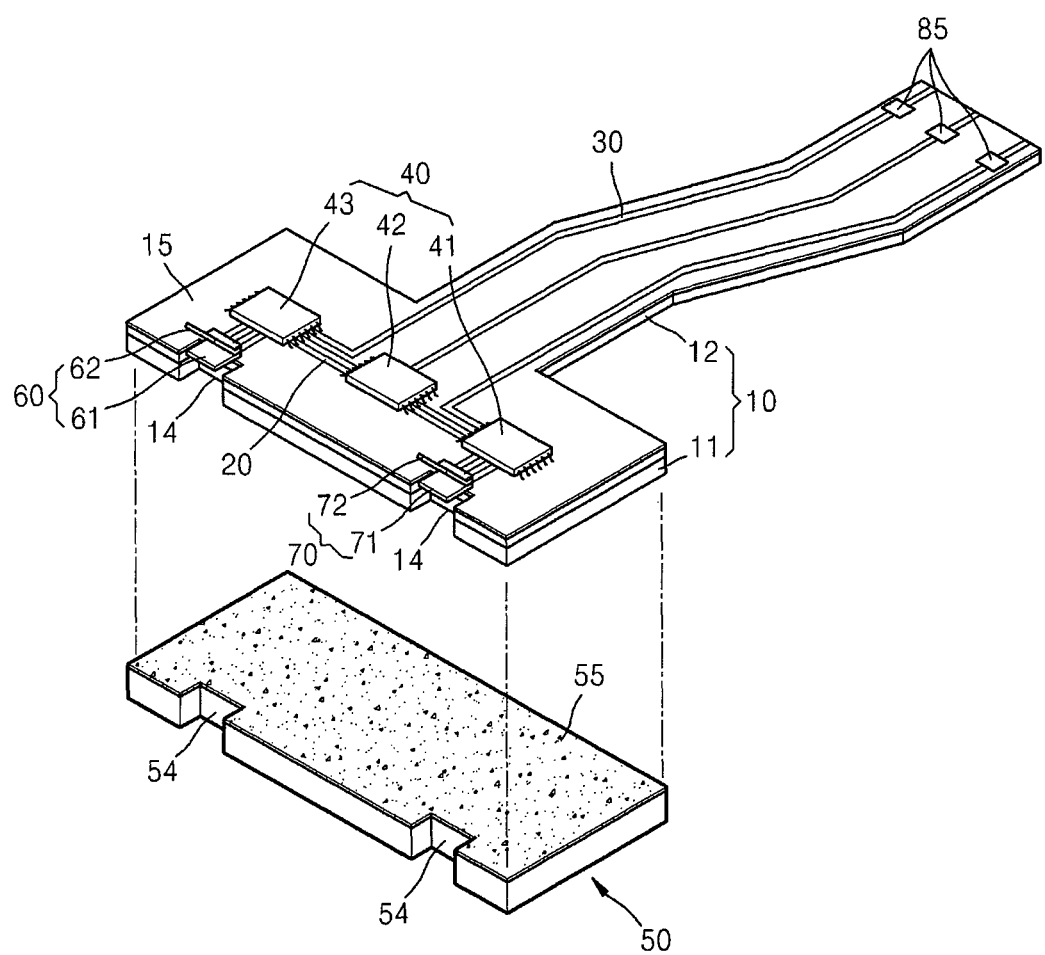
FIG. 2 is a perspective view of the protection circuit module illustrated in FIG. 1.

FIG. 2 is a perspective view of the protection circuit module 5 as illustrated in FIG. 1.

Referring to FIG. 2, the protection circuit module 5 includes the substrate 10 formed of an electrical insulator and having a first surface on which the circuit pattern unit 20 and the wiring unit 30 are formed and on which the circuit elements 40 are mounted, and the reinforcement unit 50 connected to the substrate 10.

The substrate 10 may be formed of a flexible electrical insulator. For example, the substrate 10 may be formed as a flexible and electrically insulating sheet formed of poly ethylene terephthalate (PET) or polyimide (PI).

The substrate 10 can include a circuit supporting unit 11 and a wiring supporting unit 12 extending from the circuit supporting unit 11. The circuit pattern unit 20 may be formed of an electrical conductor and may be formed on a first surface of the circuit supporting unit 11. The wiring unit 30 may be formed of an electrical conductor, be electrically connected to the circuit pattern unit 20, and extend along a surface of the wiring supporting unit 12. The circuit pattern unit 20 and the wiring unit 30 may be formed by patterning an electrical conductor such as copper (Cu) or Ni on the first surface of the substrate 10.

External terminals 85 electrically connected to the wiring unit 30 and externally exposed for electrical connection to an external device may be formed at an end of the wiring supporting unit 12. The structure of the external terminals 85 is not limited to that illustrated in FIG. 2, and a connector assembly including the external terminals 85 to be electrically connected to the wiring unit 30 may be combined to the end of the wiring supporting unit 12.

If a protection layer 15 for circuit protection is formed by using an insulating film on the first surface of the substrate 10, on which the circuit pattern unit 20 and the wiring unit 30 are formed, a flexible printed circuit board (FPCB) can be completely formed.

The circuit elements 40 may be mounted on the first surface of the substrate 10. The circuit elements 40 may include a circuit protection module 41, a positive temperature coefficient (PTC) thermistor 42, and a passive device 43.

The circuit protection module 41 may be any of various protection circuits and electrical devices for controlling charge and discharge, e.g., a charge/discharge field-effect transistor (FET), a fuse, a temperature sensor, a controller, or a sensor resistor.

The PTC 42 can have an electrical resistance that increases to almost infinity when temperature exceeds a threshold value, and can thus block the flow of a charge/discharge current when a battery is at an excessively high temperature. Since the PTC 42 operates reversibly, if the temperature of the battery is lowered below the threshold value after the PTC 42 blocks the flow of the current, the resistance of the PTC 42 can be reduced and the battery may operate normally.

The passive device 43 may be, for example, a resistor for suppressing static electricity, a capacitor for suppressing a variation in power supply, an inductor, or a diode.

The reinforcement unit 50 for supporting the circuit supporting unit 11 may be formed on a second surface of the circuit supporting unit 11. In FIGS. 1 and 2, the reinforcement unit 50 may be formed as a hard insulating substrate and may be bonded to the second surface of the circuit supporting unit 11 by using an adhesive 55. For example, the reinforcement unit 50 may be formed of a hard material for forming a printed circuit board (PCB), and the adhesive 55 may be sheet-type pre-impregnated, or prepreg, composites formed by impregnating carbon fiber, glass fiber, or unidirectionally aligned fiber into various resins.

The protection circuit module 5 can further include the terminal connection units 60 and 70. First ends of the terminal connection units 60 and 70 may be connected to the circuit pattern unit 20 and second ends of the terminal connection units 60 and 70 may extend toward an edge of the circuit supporting unit 11. The terminal connection units 60 and 70 may be formed by thinly coating an electrical conductor such as Ni on the first surface of the substrate 10. The terminal connection units 60 and 70 may respectively include electrode layers 61 and 62, and 71 and 72.

The first ends of the electrode layers 61, 62, 71, and 72 may be connected to the circuit pattern unit 20 and may be covered by the protection layer 15, and the second ends of the electrode layers 61, 62, 71, and 72 may be separated from each other. Upper electrode layers 62 and 72 may be bent upward as illustrated in FIGS. 1 and 2 so that gaps are formed between the upper electrode layers 62 and 72 and the lower electrode layers 61 and 71, the positive and negative electrode tabs 240 and 250 may be respectively inserted between the electrode layers 61 and 62, and 71 and 72, the upper electrode layers 62 and 72 may be bent downward, and then a welding operation may be performed.

The battery module 200 may be, for example, a lithium (Li) rechargeable battery module. For an electrochemical reaction, the positive electrode tab 240 of the battery module 200 may be formed of Al and the negative electrode tab 250 of the battery module 200 may be formed of Cu or Ni. Since the positive and negative electrode tabs 240 and 250 are formed of different materials, when the positive and negative electrode tabs 240 and 250 are respectively welded to the terminal connection units 60 and 70, the terminal connection unit 60 and the positive electrode tab 240 may not be easily welded to each other. However, in the protection circuit module 5 illustrated in FIG. 2, the terminal connection units 60 and 70 may respectively include two separable electrode layers 61 and 62, and 71 and 72 so as to support the positive and negative electrode tabs 240 and 250 from opposite sides, and thus the welding operation may be easily performed and the error rate may be minimized.

Figure 3:
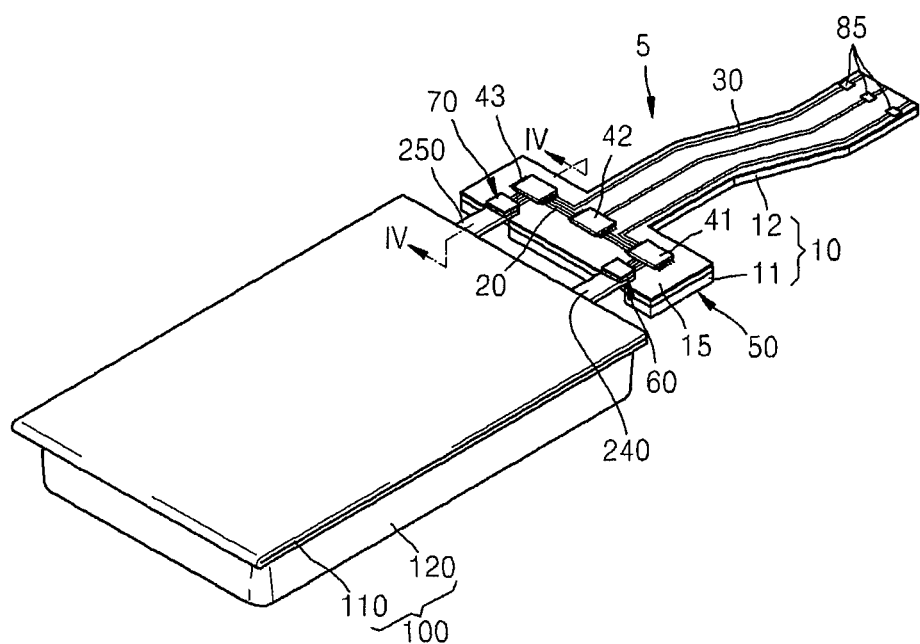
FIG. 3 is a perspective view of the rechargeable battery illustrated in FIG. 1, in which the protection circuit module is connected to a battery module, according to an embodiment of the present invention.
Figure 4:
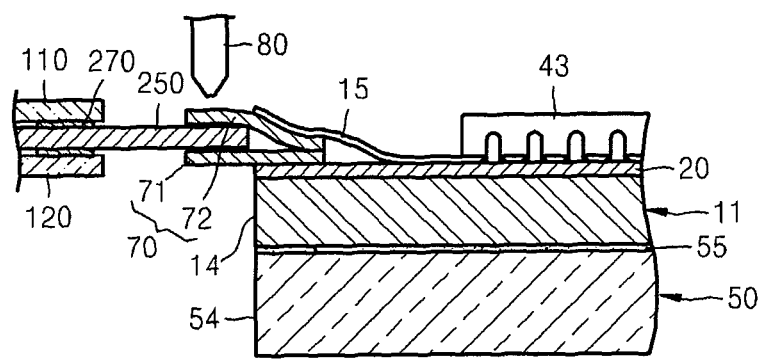
FIG. 4 is a cross-sectional view taken along a line IV-IV illustrated in FIG. 3.

FIG. 3 is a perspective view of the rechargeable battery illustrated in FIG. 1, in which the protection circuit module 5 is connected to the battery module 200, according to an embodiment of the present invention. FIG. 4 is a cross-sectional view taken along a line IV-IV illustrated in FIG. 3.

Referring to FIGS. 3 and 4, the circuit supporting unit 11 includes openings 14 corresponding to the terminal connection units 60 and 70 so as to expose the terminal connection units 60 and 70. Also, the reinforcement unit 50 can include openings 54 corresponding to the openings 14 of the circuit supporting unit 11. Accordingly, when a welding operation is performed by using a welding rod 80 as illustrated in FIG. 4, connected portions between the terminal connection units 60 and 70 and the positive and negative electrode tabs 240 and 250 may be accessed through the openings 14 of the circuit supporting unit 11. Since the openings 54 corresponding to the terminal connection units 60 and 70 may be formed in the reinforcement unit 50, the reinforcement unit 50 and the circuit supporting unit 11 may not be thermally strained due to heat transferred while the welding operation is performed.

Figure 5:
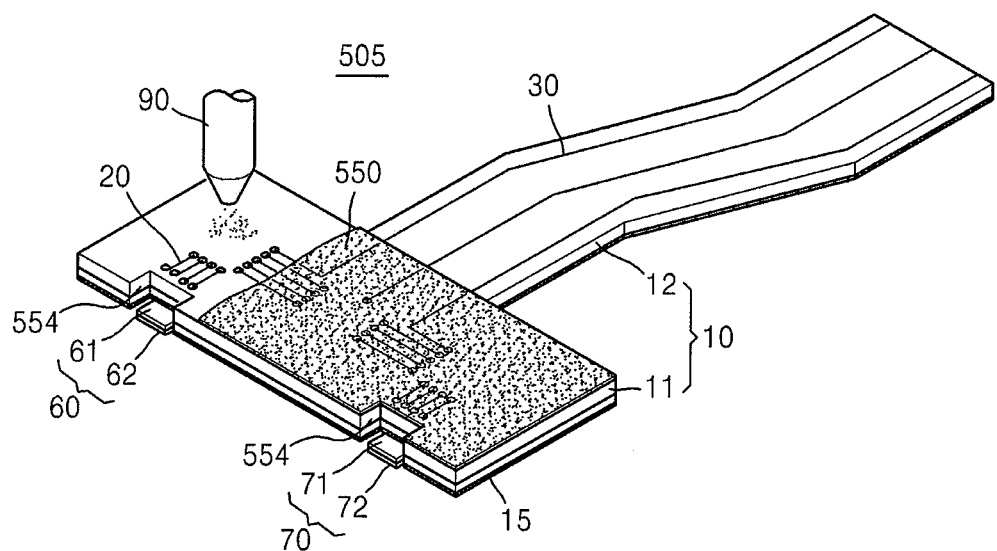
FIG. 5 is a perspective view showing a process for manufacturing a protection circuit module of a rechargeable battery, according to another embodiment of the present invention.
Figure 6:
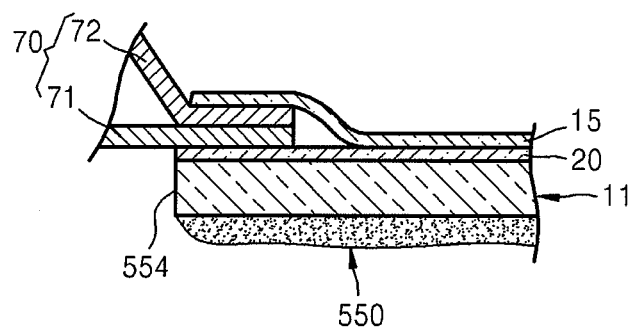
FIG. 6 is a cross-sectional view when the protection circuit module illustrated in FIG. 5 is completely manufactured.

FIG. 5 is a perspective view showing a process for manufacturing a protection circuit module 505 of a rechargeable battery, according to another embodiment of the present invention. FIG. 6 is a cross-sectional view when the protection circuit module 505 illustrated in FIG. 5 is completely manufactured.

In FIGS. 5 and 6, the overall structure of the protection circuit module 505 may be similar to that of the protection circuit module 5 illustrated in FIGS. 1 through 4 and the form of a reinforcement unit 550 can be modified from that of the reinforcement unit 50 illustrated in FIGS. 1 through 4. Like reference numerals in the drawings denote like elements.

The protection circuit module 505 may include the substrate 10 formed of an electrical insulator and having a first surface on which the circuit pattern unit 20 and the wiring unit 30 are formed and on which the circuit elements 40 are mounted, and a reinforcement unit 550 connected to the substrate 10. The substrate 10 may include the circuit supporting unit 11 and the wiring supporting unit 12 extending from the circuit supporting unit 11. Although not shown in FIGS. 5 and 6, a plurality of circuit elements may be mounted on the first surface of the substrate 10, on which the reinforcement unit 550 is not formed.

The reinforcement unit 550 may be formed by molding a resin on the second surface of the circuit supporting unit 11. As illustrated in FIG. 5, the reinforcement unit 550 may be formed by coating a resin on the second surface of the circuit supporting unit 11 by using a resin molding nozzle 90. Since the reinforcement unit 550 is not coated on openings 554 formed at an edge of the circuit supporting unit 11, even after the reinforcement unit 550 is formed, the terminal connection units 60 and 70 may be exposed through the openings 554. As the reinforcement unit 550 is formed by molding a resin as described above, the circuit supporting unit 11 may be stably supported and the protection circuit module 505 may be strongly resistant against noise.

In FIGS. 5 and 6, the first ends of the terminal connection units 60 and 70 may be connected to the circuit pattern unit 20 and the second ends of the terminal connection units 60 and 70 can extend toward the edge of the circuit supporting unit 11. The terminal connection units 60 and 70 may be formed by thinly coating an electrical conductor such as Ni on the first surface of the substrate 10. The terminal connection units 60 and 70 may respectively include the electrode layers 61 and 62, and 71 and 72.

The first ends of the electrode layers 61, 62, 71, and 72 may be connected to the circuit pattern unit 20 and may be covered by the protection layer 15, and the second ends of the electrode layers 61, 62, 71, and 72 may be separated from each other. The upper electrode layers 62 and 72 may be bent upward as illustrated in FIGS. 1 and 2 so that gaps are formed between the upper electrode layers 62 and 72 and the lower electrode layers 61 and 71, the positive and negative electrode tabs 240 and 250 may be respectively inserted between the electrode layers 61 and 62, and 71 and 72, the upper electrode layers 62 and 72 may be bent downward, and then a welding operation may be performed.

Since the openings 554 may be formed where the terminal connection units 60 and 70 are welded, the reinforcement unit

550 and the circuit supporting unit 11 may not be thermally strained due to heat transferred while the welding operation is performed.

As described above, for a protection circuit module of a rechargeable battery according to embodiments, because a reinforcement unit may be formed on a portion of a flexible substrate, circuits may be stably supported. Also, because each of terminal connection units may include a plurality of electrode layers, a welding operation for connecting terminal electrodes of a battery module to the terminal connection units may be easily performed. Furthermore, since openings for exposing the terminal connection units may be formed in the reinforcement unit and the substrate, elements of the protection circuit module may not be thermally damaged.

It should be understood that the certain embodiments described therein should be considered in a descriptive sense only and not for purposes of limitation. Descriptions of features or aspects within each embodiment should typically be considered as available for other similar features or aspects in other embodiments.

What is claimed is:

1. A protection circuit module of a rechargeable battery, the module comprising:
    a substrate formed of a flexible insulator and comprising a circuit supporting unit and a wiring supporting unit formed on a first surface of the substrate and extending from the circuit supporting unit;
    a conductive circuit pattern unit formed on the circuit supporting unit;
    a conductive wiring unit formed on the wiring supporting unit, wherein the wiring unit is electrically connected to the circuit pattern unit and extends along the wiring supporting unit;
    circuit elements electrically connected to the circuit pattern unit and formed on one surface of the circuit supporting unit;
    a reinforcement unit made of a hard insulating substrate formed on an opposing surface of the circuit supporting unit so as to have the same area as the circuit supporting unit and supporting the circuit supporting unit wherein the reinforcement unit is directly mounted on the opposed surface of the circuit supporting unit;
    a protection layer formed on the one surface of the substrate and covering the circuit pattern and wiring unit wherein the protection layer comprises an insulating film formed on the one surface of the substrate so as to have the same area as the circuit supporting unit; and
    conductive terminal connection units, each terminal connection unit comprising one end connected to the circuit pattern unit and an opposing end formed at an edge of the circuit supporting unit,
    wherein the protection layer, the circuit supporting unit, and the reinforcement unit comprise openings formed at a first edge of the protection layer, the circuit support unit and the reinforcing unit and extending inward therefrom so as to be aligned and corresponding to the terminal connection units and exposing the terminal connection units.

2. The module of claim 1, wherein the reinforcement unit is formed as a rigid insulating substrate and is adhered to the opposing surface of the circuit supporting unit by an adhesive.

3. The module of claim 1, wherein the reinforcement unit is formed on the opposing surface of the circuit supporting unit by molding a resin.

4. The module of claim 1, further comprising conductive terminal connection units, each terminal connection unit comprising one end connected to the circuit pattern unit and an opposing end formed at an edge of the circuit supporting unit,
    wherein the protection layer, the circuit supporting unit, and the reinforcement unit comprise openings corresponding to the terminal connection units and exposing the terminal connection units.

5. The module of claim 4, wherein each of the terminal connection units comprises a plurality of electrode layers, and
    wherein the electrode layers are separable from each other at the opposing end of each of the terminal connection units.

6. The module of claim 1, wherein external terminals are electrically connected to the wiring unit externally exposed for electrical connection to an external device, and formed at an end of the wiring supporting unit.

\* \* \* \* \*